United States Patent
Shie et al.

(10) Patent No.: US 6,768,382 B1
(45) Date of Patent: Jul. 27, 2004

(54) CIRCUIT AND TECHNIQUE FOR ACCURATE AND EFFICIENT POWER AMPLIFIER SENSING

(75) Inventors: Terry Shie, Cedar Rapids, IA (US); Russ Wyse, Center Pt., IA (US); David Ripley, Cedar Rapids, IA (US); Paul Andrys, Swisher, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/401,920

(22) Filed: Mar. 28, 2003

(51) Int. Cl.[7] .................................................. H03F 3/04
(52) U.S. Cl. ...................................... 330/296; 330/297
(58) Field of Search ................................ 330/296, 297, 330/298, 207 P

(56) References Cited

U.S. PATENT DOCUMENTS 6,509,722 B2 * 1/2003 Lopata ........................ 323/280

2003/0201834 A1 * 10/2003 Pehlke

OTHER PUBLICATIONS

IBM Technical Disclosure Bulletin Apr. 1, 1981, US vol. 23, Issue II pp 4898–4899.*

* cited by examiner

Primary Examiner—Michael B. Shingleton
(74) Attorney, Agent, or Firm—Farjami & Farjami LLP

(57) ABSTRACT

In one exemplary embodiment, a sensing circuit for sensing an output power of a power amplifier comprises a biasing circuit coupled to a detection circuit. The biasing circuit feeds a base current to the power amplifier, and the detection circuit draws a mirror current of the base current. The mirror current is fed at a first node to each of an impedance circuit and a first FET, wherein a sense voltage is generated at the first node. In one exemplary embodiment, the first FET is activated when a beta parameter of the power amplifier decreases.

20 Claims, 3 Drawing Sheets

US 6,768,382 B1

CIRCUIT AND TECHNIQUE FOR ACCURATE AND EFFICIENT POWER AMPLIFIER SENSING

BACKGROUND OF THE INVENTION

1. Field of the Invention

The present invention is generally in the field of semiconductor devices. More specifically, the invention is in the field of semiconductor amplifiers.

2. Related Art

Power amplifiers are used in a number of applications, including mobile telephones, for amplifying an input signal. In order to accurately control the output power of a power amplifier, it is necessary to accurately detect its output power. Thus, various power amplifier sensing techniques have been used for measuring the output power of a power amplifier.

Current power amplifier sensing techniques, however, suffer various disadvantages. For example, in a coupler/detector arrangement, the detector is coupled to the output stage of the power amplifier resulting in appreciable loss of power at the output of the power amplifier. This loss of power, in turn, results in undesirable inefficient operation of the power amplifier. Furthermore, coupler/detector arrangements are expensive to implement and occupy large circuit areas, both of which are undesirable.

In other approaches, sensing circuits detect the power amplifier collector current. Examples of these techniques include direct collector current sensing and indirect collector current sensing. Direct collector current sensing, however, is particularly inefficient at the peak power output of the power amplifier, effectively reducing the maximum output power of the power amplifier. Furthermore, the direct collector current sensing approach requires the use of complex techniques and expensive components for proper operation and in order to provide adequate dynamic range. Indirect collector current sensing, likewise, operates inefficiently. Moreover, the indirect collector current sensing approach requires the use of complex techniques and expensive components, e.g., a scaled load line for accurate tracking of the reference collector current to the output collector current, which results in increased manufacturing costs and enlarged device size.

Accordingly, there is a strong need in the art for a small, low cost circuit and technique capable of efficiently and accurately sensing the output power of a power amplifier.

SUMMARY OF THE INVENTION

The present invention is directed to circuit and technique for accurate and efficient power amplifier sensing. The invention overcomes the need in the art for a small, low cost circuit and technique capable of efficiently and accurately sensing the output power of a power amplifier.

In one exemplary embodiment, a sensing circuit for sensing an output power of a power amplifier comprises a biasing circuit coupled to a detection circuit. The biasing circuit feeds a base current to the power amplifier, and the detection circuit draws a mirror current of the base current. The mirror current is fed at a first node to each of an impedance circuit and a first FET, wherein a sense voltage which accurately tracks the output power of the power amplifier is generated at the first node. In one exemplary embodiment, the first FET is activated when a beta parameter of the power amplifier decreases.

According to one particular embodiment, the impedance circuit comprises a resistor. In another exemplary embodiment, the impedance circuit comprises a resistor in series with a diode. According to one particular embodiment, a first end of the impedance circuit is connected to a drain and a gate of the first FET at the first node. In this particular embodiment, a second end of the impedance circuit is coupled to a source of the first FET at a second node, and the second node is connected to a reference voltage, such as a ground voltage.

According to another particular embodiment, the biasing circuit comprises a second FET, and the detection circuit comprises a third FET. In this particular embodiment, a gate of the second FET is coupled to a gate of the third FET in a current mirror configuration. A drain of the second FET is coupled to a base of the power amplifier; a source of the second FET is coupled to a supply voltage; a drain of the third FET is connected to the first node; and a source of the third FET is coupled to the supply voltage. In certain embodiments, the biasing circuit further comprises an operational amplifier, where an output of the operational amplifier is connected to the gate of the second FET, and a noninverting input of the operation amplifier is connected to the drain of the second FET. In this particular embodiment, a bias voltage is supplied to an inverting input of the operation amplifier to control the output power of the power amplifier.

According to various embodiments of the invention, accurate and efficient detection of the output power of the power amplifier is achieved. Furthermore, manufacturing costs and device size are also reduced. Other features and advantages of the present invention will become more readily apparent to those of ordinary skill in the art after reviewing the following detailed description and accompanying drawings.

DETAILED DESCRIPTION OF THE INVENTION

The present invention is directed to circuit and technique for accurate and efficient power amplifier sensing. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
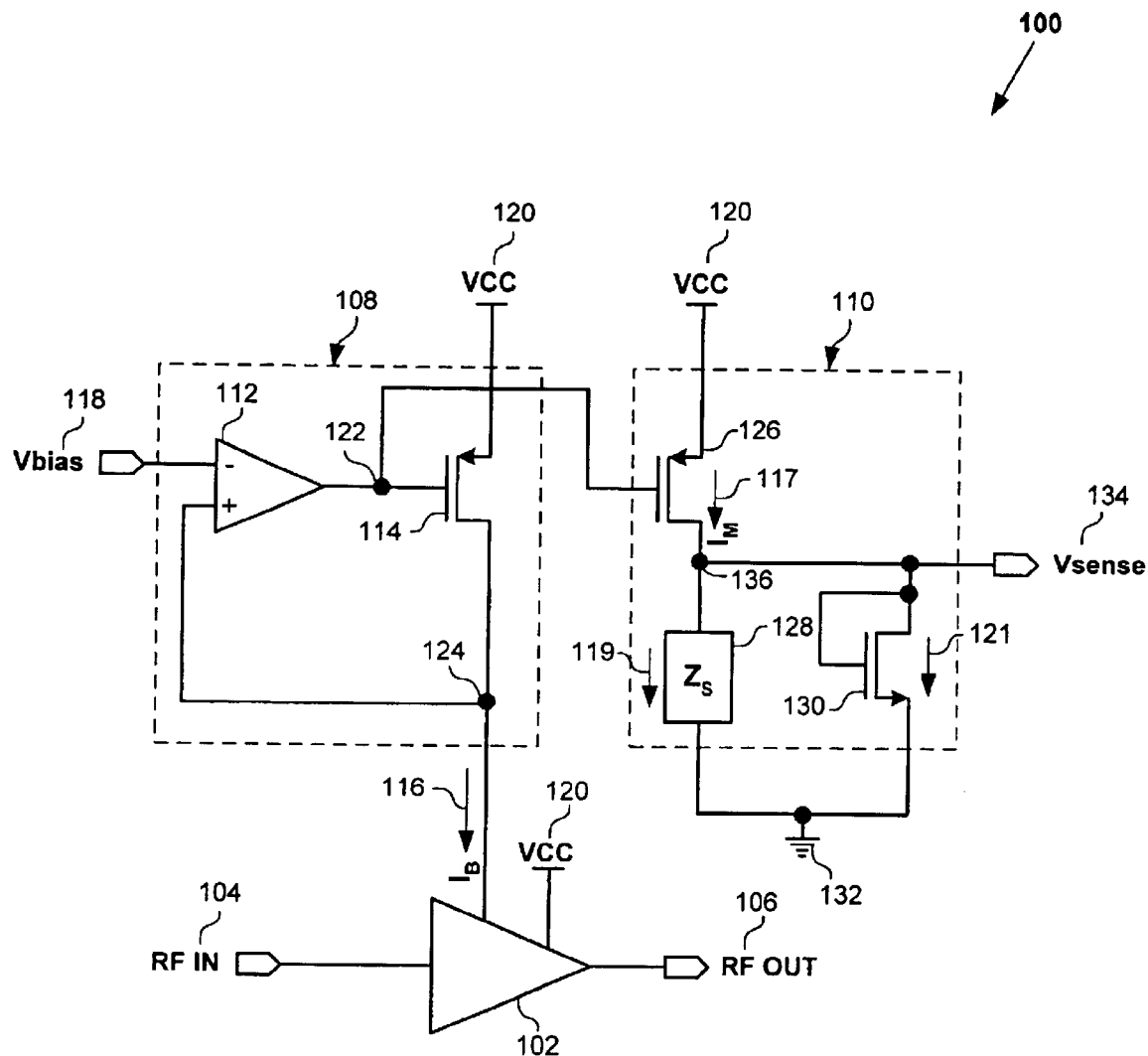
FIG. 1 illustrates a schematic diagram of an exemplary power amplifier sensing circuit in accordance with one embodiment of the present invention.

Referring to FIG. 1, there is shown a schematic diagram of power amplifier sensing circuit 100 in accordance with one embodiment of the present invention (in the present application, power amplifier sensing circuit 100 is referred to as "sensing circuit 100" to preserve brevity). By way of example, sensing circuit 100 may be utilized in a wireless device, such as a mobile telephone, for sensing power of output signal ("RF OUT") 106 of power amplifier 102.

In general, sensing circuit 100 employs indirect base current sensing to generate sense voltage ("Vsense") 134 which, due to the particular arrangement of sensing circuit 100, is an extremely accurate measure of the power outputted by RF OUT 106. Moreover, as described more fully below, Vsense 134 is generated with very low impact on the efficiency of power amplifier 102. Compared to known sensing circuits, for example, sensing circuit 100 does not reduce the maximum output power (corresponding to maximum power at RF OUT 106) of power amplifier 102. As a result, sensing circuit 100 results in substantially reduced impact on the power added efficiency of power amplifier 102 and significantly reduced insertion loss. Furthermore, sensing circuit 100 is significantly less expensive to manufacture than known sensing circuits and is considerably smaller in size compared to other known approaches.

In the present exemplary embodiment shown in FIG. 1, sensing circuit 100 comprises biasing circuit 108 coupled to detection circuit 110. Biasing circuit 108 is connected to power amplifier 102. By way of example, power amplifier 102 may be a power amplifier for a mobile telephone (not shown) for receiving and amplifying input signal ("RF IN") 104 and generating RF OUT 106. Supply voltage (VCC) 220 is also supplied to power amplifier 102.

Biasing circuit 108 and detection circuit 110 generate Vsense 134 in a particularly efficient and accurate manner through the indirect base current sense approach of the invention. Vsense 134 thus corresponds very closely to the power outputted by RF OUT 106 generated by power amplifier 102 and can be used, for example, to accurately control power amplifier 102, e.g., by adjusting bias voltage (Vbias) 118, as described below.

Indirect base current sense approach is based on several principles. First, the output power (corresponding to power at RF OUT 106) of power amplifier 102 is directly related to the collector current ($I_C$) of the output stage of power amplifier 102. Second, base current ($I_B$) 116 and the $I_C$ of power amplifier 102 are related by the beta (β) parameter of power amplifier 102. Equation 1 sets forth the relationship between $I_B$ 116, $I_C$ and β:

$$I_C = \beta I_B \quad \text{(Equation 1)}.$$

Thus, $I_B$ 116 closely correlates with RF OUT 106 and β of power amplifier 102.

Continuing with reference to FIG. 1, biasing circuit 108 comprises p-channel FET (PFET) 114 and operational amplifier 112. The gate terminal of PFET 114 is connected to the output of operational amplifier 112 at node 122. The source terminal of PFET 114 is connected to VCC 120. The drain terminal of PFET 114 is connected to the noninverting input of operational amplifier 112 at node 124. $I_B$ 116 drawn from node 124 is fed to the base terminal of power amplifier 102. Bias voltage (Vbias) 118 is supplied to the inverting input of operation amplifier 112 to control the operation of power amplifier 102. For example, Vbias 118 can be adjusted, i.e., increased or decreased based on a desired output power of power amplifier 102. Since an accurate measure of power at RF OUT 106 can be obtained from Vsense 134, accurate control of power amplifier 102 can be made by way of Vbias 118.

Detection circuit 110 comprises PFET 126, impedance circuit ($Z_S$) 128 and n-channel FET (NFET) 130. The gate terminal of PFET 126 is coupled to the gate terminal of PFET 114 in current mirror configuration; that is, during operation, current $I_M$ 117 drawn through PFET 126 is a mirrored current of $I_B$ 116, and is thus directly proportional to $I_B$ 116 fed to power amplifier 102. In FIG. 1, the operation of PFET 114 and PFET 126 in a current mirror configuration is enhanced by "matching" the two PFET transistors 114 and 126 and by supplying the same gate-to-source voltage ($V_{GS}$) for each PFET 114 and 126. The source terminal of PFET 126 is coupled to VCC 120. The drain terminal of PFET 126 is coupled, at node 136, to each of a first end of $Z_S$ 128 and the drain terminal of NFET 130. The gate terminal of NFET 130 is also coupled to the drain terminal of NFET 130 at node 136. The second end of $Z_S$ 128 is coupled to ground 132, and the source terminal of NFET 130 is coupled to ground 132.

According to the exemplary embodiment shown in FIG. 1, PFET 114 feeds $I_B$ 116 to the base terminal of power amplifier 102. As described above, $I_B$ 116 corresponds to the $I_C$ of power amplifier 102, which in turn, corresponds to the power provided by RF OUT 106. PFET 114 and PFET 126 are configured in a current mirror configuration, such that $I_M$ 117, which is fed to node 136, corresponds closely with $I_B$ 116. In this way, $I_M$ 117 also corresponds closely with the power outputted by RF OUT 106.

Close tracking of the power at RF OUT 106 is achieved due to the particular arrangement of sensing circuit 100, even when power amplifier 102 is producing power close to maximum at RF OUT 106. The reason is that NFET 130 is not activated until β of power amplifier 102 begins to decrease, which typically occurs when power amplifier 102 is producing power close to maximum at RF OUT 106. As a result, when power amplifier 102 is producing less than maximum at RF OUT 106, NFET 130 is off, and current 119 (through $Z_S$ 128) is substantially equal to $I_M$ 117; thus, Vsense 134, which is generated at node 136, corresponds to current 119 (which is equal to $I_M$ 117 under these conditions) multiplied by the impedance value of $Z_S$ 128. Vsense 134, thus, closely tracks the power outputted at RF OUT 106.

When power amplifier 102 is producing power close to maximum at RF OUT 106, however, β of power amplifier 102 begins to decrease. In accordance with Equation 1, due to the decrease in β during these conditions, $I_B$ 116 increases proportionally higher for a given increase in $I_C$. In the absence of sensing circuit 100, such a change in β would ordinarily translate to improper correlation between $I_B$ 116 and the power at RF OUT 106. However, in detection circuit 110, NFET 130 functions to compensate for this increase in $I_B$ 116 when β decreases so that Vsense 134 more accurately tracks the power at RF OUT 106.

As pointed out above, NFET 130 is configured to switch on when power amplifier 102 is producing power close to maximum at RF OUT 106. For example, NFET 130 can be biased to operate in this manner by selection of the impedance value of $Z_S$ 128 such that the $V_{GS}$ of NFET 130 exceeds the threshold voltage ($V_T$) of NFET 130 when power amplifier 102 is producing power close to maximum at RF OUT 106, i.e., when β of power amplifier 102 begins to decrease. When NFET 130 is switched on, NFET 130 draws current 121, resulting in a decrease in current 119 through $Z_S$ 128. NET 130 effectively "bleeds off" the increase in $I_B$ 116 which is mirrored by $I_M$ 117. Due to the arrangement of detection circuit 110, NFET 130 compensates for the increase in $I_B$ 116 (and mirrored by $I_M$ 117) and, thus, Vsense 134 (corresponding to current 119 multiplied by the impedance value of $Z_S$ 128) more accurately tracks the power at RF OUT 106, even when power amplifier 102 is producing power close to maximum at RF OUT 106, and β of power amplifier 102 begins to decrease.

Furthermore, due to the particular arrangement of sensing circuit 100 which employs indirect base current sensing, sensing circuit 100 results in very little impact upon the efficiency of power amplifier 102. For example, sensing circuit 100 does not reduce maximum power at RF OUT 106 of power amplifier 102 unlike known approaches, such as the coupler/detector approach and direct collector current sense approach, for example. Moreover, sensing circuit 100 employs inexpensive components and, compared to other known solutions, does not occupy large circuit areas. In sum, sensing circuit 100 provides a small, low cost circuit and technique capable of efficiently and accurately sensing the output power of a power amplifier.

Figure 2:
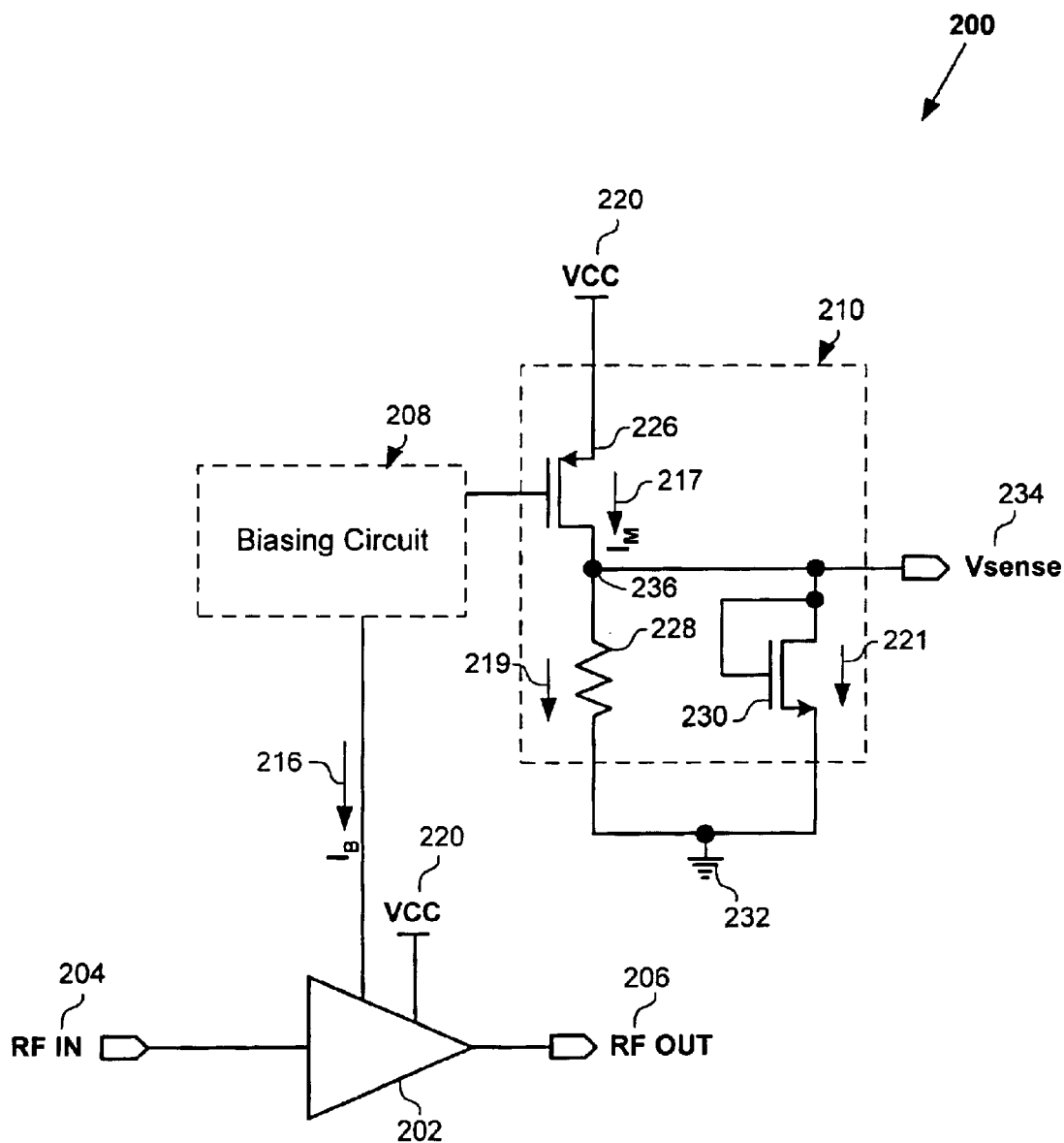
FIG. 2 illustrates a schematic diagram of another exemplary power amplifier sensing circuit in accordance with one embodiment of the present invention.

FIG. 2 shows a schematic diagram of sensing circuit 200 in accordance with one exemplary embodiment of the present invention. In FIG. 2, power amplifier 202, VCC 220, ground 232, biasing circuit 208, $I_B$ 216, PFET 226, NFET 230, $I_M$ 217, current 219 and current 221 respectively correspond to power amplifier 102, VCC 120, ground 132, biasing circuit 108, $I_B$ 116, PFET 126, NFET 130, $I_M$ 117, current 119 and current 121 in FIG. 1. Detection circuit 210 replaces detection circuit 110 in FIG. 1, and thus the gate terminal of FET 226 is connected to biasing circuit 208 for drawing mirror current ($I_M$) 217 which is a mirrored current of $I_B$ 216.

In FIG. 2, PFET 226 and NFET 230 are configured similar to PFET 126 and NFET 130, respectively, as described above in FIG. 1, while impedance circuit 128 of FIG. 1 is replaced by resistor 228, which is connected at one end to node 236 and at another end to ground 232. More particularly, resistive value of resistor 228 is selected to bias NFET 230 such that the $V_{GS}$ of NFET 230 exceeds the threshold voltage ($V_T$) of NFET 230 when power amplifier 202 is producing power close to maximum at RF OUT 206 and β of power amplifier 202 begins to decrease. When used in conjunction with biasing circuit 208, detection circuit 210 generates Vsense 234 at node 236. As described above, Vsense 234—corresponding to current 219 multiplied by resistive value of resistor 228—accurately tracks the power outputted by RF OUT 206, even when β of power amplifier 202 decreases. With this arrangement accurate and efficiently tracking of the power at RF OUT 206 of power amplifier 202 is achieved in an inexpensive manner and with a small-size circuit arrangement as discussed above.

Figure 3:
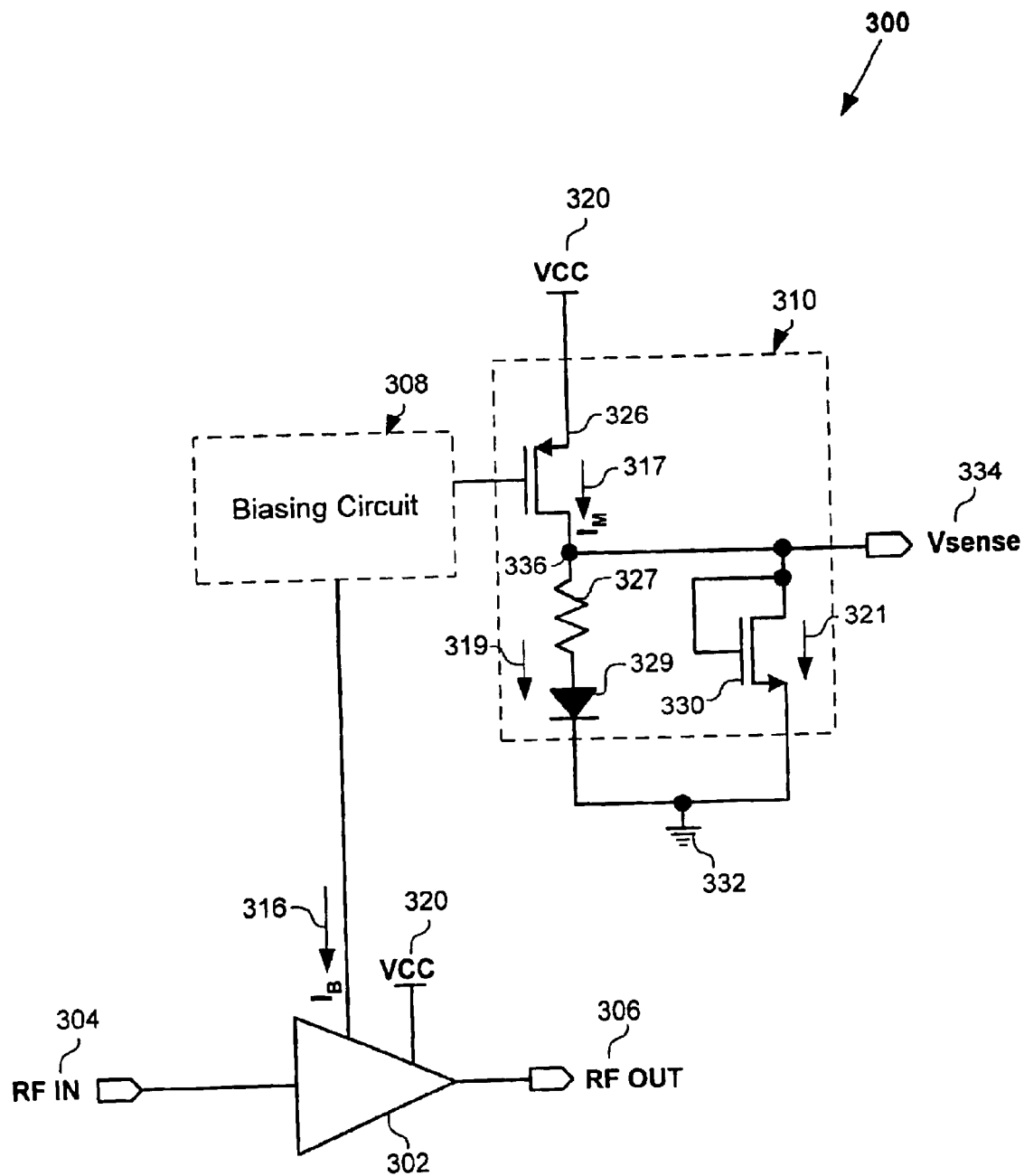
FIG. 3 illustrates a schematic diagram of another exemplary power amplifier sensing circuit in accordance with one embodiment of the present invention.

FIG. 3 shows a schematic diagram of sensing circuit 300 in accordance with another exemplary embodiment of the present invention. In FIG. 3, power amplifier 302, VCC 320, ground 332, biasing circuit 308, $I_B$ 316, PFET 326, NFET 330, $I_M$ 317, current 319 and current 321 respectively correspond to power amplifier 102, VCC 120, ground 132, biasing circuit 108, $I_B$ 116, PFET 126, NFET 130, $I_M$ 117, current 119 and current 121 in FIG. 1. Detection circuit 310 replaces detection circuit 110 in FIG. 1, and thus the gate terminal of FET 326 is connected to biasing circuit 308 for drawing mirror current ($I_M$) 317 which is a mirrored current of $I_B$ 316.

In FIG. 3, impedance circuit 128 of FIG. 1 is replaced by resistor 327 in series with diode 329 for even further increased accuracy in tracking the power at RF OUT 306 of power amplifier 302 and yielding better dynamic range in sensing circuit 300. In this configuration, one end of resistor 327 is connected to node 336; another end of resistor 327 is connected to the anode of diode 329; the cathode of diode 329 is connected to ground 332. PFET 326 and NFET 330 are configured similar to PFET 126 and NFET 130, respectively, as described above in FIG. 1. Increased accuracy in tracking the power at RF OUT 306 is achieved with detection circuit 310, particularly at low RF OUT 306 (corresponding to low $I_B$ 316, low $I_M$ 317 and low current 319 through resistor 327 and diode 329). The reason is that a small increase in current 319 through diode 329 corresponds to a rapid increase in voltage across diode 329 near the threshold voltage of diode 329, i.e., at low current 319. Therefore, due to the rapid increase in voltage across diode 329 at low current 319, Vsense 334—corresponding to the voltage across resistor 327 and diode 329—exhibits greater sensitivity to small changes at RF OUT 306, yielding greater dynamic range in sensing circuit 300 at low RF OUT 306.

Resistive value of resistor 327 is selected to bias NFET 330 such that the $V_{GS}$ of NFET 330 exceeds the threshold voltage ($V_T$) of NFET 330 when power amplifier 302 is producing power close to maximum at RF OUT 306 and β of power amplifier 302 begins to decrease. When used in conjunction with biasing circuit 308, detection circuit 310 generates Vsense 334 which accurately tracks the power at RF OUT 306, even when β of power amplifier 302 decreases. As described above, sensing circuit 300 provides greater efficiency over known approaches, and does not reduce maximum power outputted by RF OUT 306 of power amplifier 302. Furthermore, sensing circuit 300 is achieved in an inexpensive manner and with a small-size circuit arrangement as discussed above.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest that power amplifiers 102, 202 and/or 302 can be configured to operate in saturation or linear mode. In certain embodiments, sensing circuits 100, 200 and/or 300 can be modified to include one or more switches for switching between saturation and linear modes of operation of power amplifiers 102, 202 and/or 302. Thus, the described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, circuit and technique for accurate and efficient power amplifier sensing have been described.

What is claimed is:

1. A sensing circuit for sensing an output power of a power amplifier, said sensing circuit comprising:
    a biasing circuit feeding a base current to said power amplifier; and
    a detection circuit coupled to said biasing circuit, said detection circuit drawing a mirror current of said base current, said mirror current fed at a first node to each of an impedance circuit and a first FET, wherein a sense voltage is generated at said first node.

2. The sensing circuit of claim 1, wherein said first FET is activated when a beta parameter of said power amplifier decreases.

3. The sensing circuit of claim 1, wherein said impedance circuit comprises a resistor.

4. The sensing circuit of claim 1, wherein said impedance circuit comprises a resistor in series with a diode.

5. The sensing circuit of claim 1, wherein a first end of said impedance circuit is connected to a drain and a gate of said first FET at said first node, a second end of said impedance circuit is coupled to a source of said first FET at a second node, and said second node is connected to a reference voltage.

6. The sensing circuit of claim 5, wherein said biasing circuit comprises a second FET, said detection circuit comprises a third FET, a gate of said second FET is coupled to a gate of said third FET, a drain of said second FET is coupled to a base of said power amplifier, a source of said second FET is coupled to a supply voltage, a drain of said third FET is connected to said first node, and a source of said third FET is coupled to said supply voltage.

7. The sensing circuit of claim 6, wherein said biasing circuit further comprises an operational amplifier, an output of said operational amplifier is connected to said gate of said second FET, a noninverting input of said operation amplifier is connected to said drain of said second FET, and a bias voltage is supplied to an inverting input of said operation amplifier.

8. The sensing circuit of claim 5, wherein said reference voltage is a ground voltage.

9. The sensing circuit of claim 1, wherein said power amplifier operates in a linear mode.

10. The sensing circuit of claim 1, wherein said power amplifier operates in a saturation mode.

11. A sensing circuit for sensing an output power of a power amplifier, said sensing circuit comprising:

biasing means for feeding a base current to said power amplifier; and detecting means for generating a sense voltage, said detecting means coupled to said biasing means, said detecting means drawing a mirror current of said base current, said mirror current fed at a first node to each of an impedance circuit and a first FET, wherein said sense voltage is generated at said first node.

12. The sensing circuit of claim 11, wherein said first FET is activated when a beta parameter of said power amplifier decreases.

13. The sensing circuit of claim 11, wherein said impedance circuit comprises a resistor.

14. The sensing circuit of claim 11, wherein said impedance circuit comprises a resistor in series with a diode.

15. The sensing circuit of claim 11, wherein a first end of said impedance circuit is connected to a drain and a gate of said first FET at said first node, a second end of said impedance circuit is coupled to a source of said first FET at a second node, and said second node is connected to a reference voltage.

16. The sensing circuit of claim 15, wherein said biasing means comprises a second FET, said detecting means comprises a third FET, a gate of said second FET is coupled to a gate of said third FET, a drain of said second FET is coupled to a base of said power amplifier, a source of said second FET is coupled to a supply voltage, a drain of said third FET is connected to said first node, and a source of said third FET is coupled to said supply voltage.

17. A sensing circuit for sensing an output power of a power amplifier, said sensing circuit comprising:

a biasing circuit feeding a base current to said power amplifier; and a detection circuit coupled to said biasing circuit, said detection circuit comprising an impedance circuit, a first FET and a second FET, a first end of said impedance circuit is connected to a drain and a gate of said first FET at a first node, a second end of said impedance circuit is coupled to a source of said first FET at a second node, said second node is connected to a reference voltage, a drain of said second FET is connected to said first node, said second FET draws a mirror current of said base current, said mirror current is fed at a first node to each of said impedance circuit and said first FET, wherein a sense voltage is generated at said first node.

18. The sensing circuit of claim 17, wherein said first FET is activated when a beta parameter of said power amplifier decreases.

19. The sensing circuit of claim 17, wherein said impedance circuit comprises a resistor.

20. The sensing circuit of claim 17, wherein said impedance circuit comprises a resistor in series with a diode.

* * * * *